United States Patent
Magdefrau et al.

(10) Patent No.: US 11,168,032 B2
(45) Date of Patent: *Nov. 9, 2021

(54) METHOD OF FORMING IN-SITU BORON NITRIDE FOR CERAMIC MATRIX COMPOSITE ENVIRONMENTAL PROTECTION

(71) Applicant: Raytheon Technologies Corporation, Farmington, CT (US)

(72) Inventors: Neal Magdefrau, Tolland, CT (US); Paul Sheedy, Bolton, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 135 days.

This patent is subject to a terminal disclaimer.

(21) Appl. No.: 16/545,660

(22) Filed: Aug. 20, 2019

(65) Prior Publication Data

US 2020/0024197 A1 Jan. 23, 2020

Related U.S. Application Data

(62) Division of application No. 15/657,832, filed on Jul. 24, 2017, now Pat. No. 10,384,980, which is a division of application No. 14/674,179, filed on Mar. 31, 2015, now Pat. No. 9,732,005.

(60) Provisional application No. 61/975,960, filed on Apr. 7, 2014.

(51) Int. Cl.
| | |
|---|---|
| *C04B 35/80* | (2006.01) |
| *C04B 35/82* | (2006.01) |
| *C23C 16/34* | (2006.01) |
| *C23C 16/46* | (2006.01) |
| *C04B 35/628* | (2006.01) |

(52) U.S. Cl.
CPC ........ *C04B 35/80* (2013.01); *C04B 35/62868* (2013.01); *C04B 35/62894* (2013.01); *C04B 35/82* (2013.01); *C23C 16/342* (2013.01); *C23C 16/46* (2013.01); *C04B 2235/3821* (2013.01); *C04B 2235/3873* (2013.01); *C04B 2235/524* (2013.01); *C04B 2235/656* (2013.01)

(58) Field of Classification Search
CPC .................................................. C04B 35/6286
See application file for complete search history.

(56) References Cited

U.S. PATENT DOCUMENTS

| | | | |
|---|---|---|---|
| 4,981,822 A | 1/1991 | Singh et al. | |
| 5,045,356 A | 9/1991 | Uemura et al. | |
| 6,764,974 B2 | 7/2004 | Ohji et al. | |
| 7,687,016 B1 | 3/2010 | DiCarlo et al. | |
| 2002/0058139 A1* | 5/2002 | Morita | D01F 9/127 |
| | | | 428/367 |
| 2003/0148144 A1 | 8/2003 | Gates, Jr. et al. | |
| 2015/0004393 A1 | 1/2015 | Pegna et al. | |

FOREIGN PATENT DOCUMENTS

| | | | |
|---|---|---|---|
| CN | 101817684 | * | 9/2010 |
| CN | 103086731 A | | 5/2013 |
| JP | 2006169015 A | | 6/2006 |
| WO | 2013180764 A1 | | 12/2013 |

OTHER PUBLICATIONS

Bai, CN101817684, English abstract, Sep. 2010 (Year: 2010).*
European Search Report dated Nov. 30, 2018 for corresponding European Patent Application No. 18192289.9.
"SiC/SiC Composites With Improved BN Coating on Fibers", NASA John H. Glenn Research Center, Cleveland, Ohio, Oct. 1, 2000.
European Office action dated Nov. 10, 2017 for European Patent Application No. 15162404.6.

* cited by examiner

*Primary Examiner* — Joseph A Miller, Jr.
(74) *Attorney, Agent, or Firm* — Bachman & LaPointe, P.C.

(57) ABSTRACT

A method for forming in situ a boron nitride reaction product locally on a reinforcement phase of a ceramic matrix composite material includes the steps of providing a ceramic matrix composite material having a fiber reinforcement material; and forming in situ a layer of boron nitride on the fiber reinforcement material.

4 Claims, No Drawings

METHOD OF FORMING IN-SITU BORON NITRIDE FOR CERAMIC MATRIX COMPOSITE ENVIRONMENTAL PROTECTION

CROSS-REFERENCE TO RELATED APPLICATIONS

This application is a Divisional of U.S. patent application Ser. No. 15/657,832, filed Jul. 24, 2017, which is a divisional of Ser. No. 14/674,179, filed Mar. 31, 2015, now U.S. Pat. No. 9,732,005, issued Aug. 15, 2017, which claims the benefit of provisional application Ser. No. 61/975,960, filed Apr. 7, 2014.

BACKGROUND

The present disclosure is directed to a method of forming in-situ a boron nitride layer which provides environmental protection for a ceramic matrix composite.

In order to enable composite behavior, ceramic matrix composites (CMCs), such as a silicon carbide-based CMC, require a weak fiber interface coating which typically consists of an amorphous or turbostratic (partially crystalline) boron nitride (BN) inner layer and an outer layer of one or more of silicon carbide (SiC), silicon nitride ($Si_3N_4$), boron carbide ($B_4C$), or carbon (C), all of which are deposited by chemical vapor deposition. In terms of stability/reactivity, a more highly crystalline boron nitride phase is desirable and can offer greater protection against molten silicon attack during processing compared to amorphous or turbostratic boron nitride.

SUMMARY

In accordance with the present disclosure, there is provided a method for producing highly crystalline, hexagonal boron nitride via an in-situ reaction between boron carbide ($B_4C$) and silicon nitride ($Si_3N_4$).

In accordance with the present disclosure, there is provided a method for forming in situ a boron nitride reaction product locally on a reinforcement phase of a ceramic matrix composite material, which method broadly comprises providing a ceramic matrix composite material having a fiber reinforcement material; and forming in situ a layer of boron nitride on the fiber reinforcement material.

In another and alternative embodiment, the forming step may comprise forming the layer of boron nitride solely on a surface of the fiber reinforcement material.

In another and alternative embodiment, the forming step may comprise forming the layer of boron nitride so that the layer of boron nitride solely surrounds the fiber reinforcement material.

In another and alternative embodiment, the providing step may comprise providing a silicon based ceramic matrix composite material having a plurality of reinforcement fibers.

In another and alternative embodiment, the providing step may comprise providing the silicon based ceramic matrix composite material with a plurality of fibers selected from the group consisting of silicon carbide (SiC), Si—C—O, Si—C—N—O, Si—B—C—N, carbon, aluminum oxide, zirconium oxide, glass, mullite, and silicon nitride fibers.

In another and alternative embodiment, the forming step comprises providing a $B_4C$ material and a $Si_3N_4$ material and heating the $B_4C$ material and the $Si_3N_4$ material to a temperature above 1200 degrees Centigrade.

In another and alternative embodiment, the heating step may comprise heating to a temperature in the range of from 1400 degrees Centigrade to 1500 degrees Centigrade to form the boron nitride reaction product.

In another and alternative embodiment, the forming step may comprise forming a hexagonal boron nitride reaction product.

In another and alternative embodiment, the $B_4C$ material and $Si_3N_4$ material providing step may comprise depositing a layer of the $B_4C$ material and a layer of the $Si_3N_4$ material on the fiber reinforcement material.

In another and alternative embodiment, the layer of the $B_4C$ material and the layer of the $Si_3N_4$ material are deposited sequentially.

In another and alternative embodiment, the $B_4C$ material and the $Si_3N_4$ material providing step may comprise depositing the $Si_3N_4$ material onto the fiber reinforcement material and providing the $B_4C$ material as filler particles in a ceramic composite material matrix surrounding the fiber reinforcement material and the $B_4C$ material being located immediately adjacent the fiber reinforcement material.

In another and alternative embodiment, the $B_4C$ material and the $Si_3N_4$ material providing step comprises depositing the $B_4C$ material onto the fiber reinforcement material and providing the $Si_3N_4$ material as filler particles in a ceramic composite material matrix surrounding the fiber reinforcement material and the $Si_3N_4$ material being located immediately adjacent the fiber reinforcement material.

In another and alternative embodiment, the $B_4C$ material and the $Si_3N_4$ material providing step comprises applying a matrix slurry containing the $B_4C$ material and the $Si_3N_4$ material as filler particles to the fiber reinforcement material.

Further, in accordance with the present disclosure, there is provided a ceramic matrix composite material having a composite matrix and a plurality of reinforcement fibers, each of the reinforcement fibers having a layer of hexagonal boron nitride thereon and the hexagonal boron nitride not being substantially present throughout a bulk of the composite matrix.

In another and alternative embodiment, the reinforcement fibers may be selected from the group consisting of silicon carbide (SiC), Si—C—O, Si—C—N—C, Si—B—C—N, carbon, aluminum oxide, zirconium oxide, glass, mullite, and silicon nitride fibers.

In another and alternative embodiment, the ceramic matrix composite material may be used to form a part for a gas turbine engine.

In another and alternative embodiment, the part may comprise one of a combustor liner, a turbine blade, a turbine vane, exhaust flaps and seals, and a blade outer air seal.

In another and alternative embodiment, the layer of hexagonal boron nitride may surround each of the reinforcement fibers.

Other details of the method for forming in-situ boron nitride for ceramic matrix composite environmental protection are set forth in the following detailed description.

DETAILED DESCRIPTION

Ceramic matrix composites, such as silicon carbide based ceramic matrix composites, require protective interface coatings to establish a weak interface for composite behavior. However, the weak interface, which may consist of boron nitride, also offers a last line of defense against high temperature oxidation. The boron nitride layer in a melt infiltrated composite needs to be resistant to molten silicon attack. Highly crystalline boron nitride is less reactive compared to amorphous boron nitride. As used herein, the term "highly crystalline hexagonal boron nitride" refers to hexagonal boron nitride having an interplanar spacing of 3.33 Angstroms for the [002] planes. Turbostratic boron nitride would be less well defined and would have spacing of 3.5 to 3.8 Angstroms for the same [002] planes. In more simple terms, highly crystalline means more ordered. Some boron nitride coatings may be deposited in a completely unordered structure (i.e. amorphous) or with varying degrees of order (or crystallinity). Turbostratic BN is in the middle— it displays regions of crystal ordering similar to that of h-BN but does not maintain this over the entirety of the coating.

There is provided herein a method for forming in situ a highly crystalline, hexagonal boron nitride layer using a high temperature reaction between B4C and Si3N4. As used herein, the term "high temperature" refers to a temperature above 1200 degrees Centigrade, such as 1400 to 1500 degrees Centigrade. A particularly useful high crystalline, hexagonal boron nitride layer can be formed using numerous paths including the following: (1) a reaction between 2 deposited coatings, such as 2 CVD coatings; (2) a reaction between deposited Si3N4, such as CVD deposited Si3N4, with B4C filler; (3) a reaction between deposited B4C, such as CVD deposited B4C, with a Si3N4 filler; and (4) a reaction between Si3N4 and B4C fillers via a pre-preg or infiltration process using a preceramic polymer resin or other suitable carrier.

In accordance with the present disclosure, a ceramic matrix composite material having a ceramic matrix and a reinforcement phase consisting of a plurality of fibers is provided. The ceramic matrix composite material may be silicon based, such as silicon carbide based. The reinforcement phase may be a plurality of fibers selected from the group consisting of silicon carbide (SiC), Si—C—O, Si—C—N—C, Si—B—C—N, carbon, aluminum oxide, zirconium oxide, glass, mullite, and silicon nitride fibers. The ceramic matrix composite materials may be expected to find application in hot-section areas of a gas turbine engine, such as the combustor and turbine. Parts which may be formed from ceramic matrix composites described herein include combustor liners, turbine blades, turbine vanes, exhaust flaps and seals, and blade outer air seals.

The boron nitride layer to be formed in situ may be formed from B4C and Si3N4. In theory, these two materials can react at room temperature. However, to form in situ the highly crystalline, hexagonal boron nitride layer, the reactions between these two materials are performed at temperatures above 1200 degrees Centigrade, such as a temperature in the 1400° C. to 1500° C. range.

The boron nitride layer which is formed, if uniform, may have a thickness in the range of from 50 to 250 nm. More typically, due to the distribution of layer thickness of typical coating processes such as CVD (chemical vapor deposition), the minimum thickness of the BN layer may be approximately 150 nm. A useful thickness for the BN layer is in the range of from 50 to 500 nm, with a highly useful thickness in the range of from 50 to 300 nm.

As mentioned above, the desired BN layer may be formed in situ using a reaction process. For example, the BN layer may be formed by first applying a layer of either B4C or Si3N4 using a CVD process, or other suitable deposition process, on the fiber(s) forming the fiber reinforcement phase of the ceramic matrix composite and then applying a layer of the other of the B4C or Si3N4 materials also using the same or other suitable deposition process such as a CVD process. After the two layers have been deposited, they are reacted in place by applying a temperature above 1200 degrees Centigrade to form a highly crystalline, hexagonal BN layer.

If desired, the BN layer may be formed by depositing Si3N4 on the fiber(s) forming the reinforcement phase of the ceramic matrix composite via a deposition process such as a CVD process. The B4C may exist as filler particles in the matrix of the ceramic matrix composite. The matrix may be formed around the fiber(s) via a slurry or some other pre-preg or infiltration process, whereby a fluid carrier (e.g. preceramic polymer resin) is filled with particulate material (e.g. B4C particles) and infiltrated into a fiber preform or otherwise formed into the desired shape or form. The reaction would then occur at the aforementioned elevated temperatures between the two reactants, one located on the fiber(s) and the other located in the matrix surrounding, but immediately adjacent to the fiber(s). The resultant BN reaction product would be located on the surface of each fiber. At least some of the reaction product may be located in the matrix, surrounding the fiber, but not necessarily on the surface of the fiber.

In yet another scenario, the BN reaction product may be formed by depositing B4C on the fiber(s) forming the reinforcement phase of the ceramic matrix composite via a suitable deposition process, such as a CVD process. The Si3N4 may exist as filler particles in the matrix of the ceramic matrix composite. The matrix may be formed around the fiber(s) via a slurry or some other pre-preg or infiltration process, whereby a fluid carrier (e.g. preceramic polymer resin) is filled with particulate material (e.g. Si3N4 particles) and infiltrated into a fiber preform or otherwise formed into the desired shape or form. The reaction would then occur at the aforementioned elevated temperatures between the two reactants, one located on the fiber(s) and the other located in the matrix surrounding, but immediately adjacent to the fiber(s). As before, the resultant BN reaction product would be located on the surface of each fiber. At least some of the reaction product may be located in the matrix, surrounding the fiber, but not necessarily on the surface of the fiber.

In yet another alternative process, the BN reaction product may be formed using a slurry or some other pre-preg process or infiltration process. In these pre-preg processes, a fluid carrier (e.g. preceramic polymer resin) is filled with particulate material (e.g. B4C and Si3N4 particles) and infiltrated into a fiber preform. In the process, a matrix slurry (containing B4C and Si3N4 filler particles) may be applied to the fibers and subsequently the impregnated fibers may be laid up into a desired shape or form. Many different polymers may be used in these processes, including non-preceramic polymers and polycarbosilanes such StarPCS SMP-10 from Starfire Systems, Inc. After the matrix slurry is applied to the fibers, the impregnated fibers can be subjected to the elevated temperature for a time period in the range of from 1.0 minute to 24 hours.

Using the methods described herein, a highly crystalline, hexagonal boron nitride layer is formed. The boron nitride layer is thus more resistant to silicon and oxidative attack. The boron nitride layer is typically an inner layer. In some instances, the boron nitride layer may be an intermediate, outer or only layer.

The methods described herein result in a very localized occurrence of the reactions, local to the reinforcement phase (primarily a fiber or fibers in a fiber composite). The reactions do not occur throughout the bulk of the composite matrix. The reaction product produced by the methods described herein is thus located on the surface of the reinforcement or just surrounding the reinforcement formed by the fiber or fibers.

Low temperature CVD BN is amorphous or turbostratic BN (a-BN or t-BN) and do not provide the protection provided by the BN reaction product layer produced by the methods described herein.

The method described herein provides numerous benefits for protecting ceramic fiber materials from molten silicon attack and environmental oxidative attack. In-situ formation of BN via a reaction process promotes a more crystalline boron nitride material than could be formed via typical low temperature CVD processes. This highly crystalline boron nitride can offer additional protection against molten silicon attack during processing. In most cases, an outer coating layer of either Si3N4 or SiC is required in order to protect the BN from oxidizing during composite processing. However, this outer layer (as SiC or Si3N4) does not necessarily offer any mechanical property benefits to the composite, but by converting the outer layer (of Si3N4) to BN, it is possible to promote "outside" de-bonding of the coating/matrix which can have additional mechanical property benefits.

There has been provided herein a method for forming in situ boron nitride for ceramic matrix composite environmental protection. While the method has been described in the context of specific embodiments thereof, other unforeseen alternatives, modifications, and variations may become apparent to those skilled in the art having read the foregoing description. Accordingly, it is intended to embrace those alternatives, modifications, and variations as fall within the broad scope of the appended claims.

What is claimed is:

1. A method for forming in situ a boron nitride reaction product locally on a reinforcement phase of a ceramic matrix composite material, said method comprising:
    providing a ceramic matrix composite material having a fiber reinforcement material;
    providing a B4C material and a Si3N4 material and depositing a layer of said B4C material and a layer of said Si3N4 material on said fiber reinforcement material, wherein said layer of said B4C material and said layer of said Si3N4 material are deposited sequentially;
    heating said B4C material and said Si3N4 material to a temperature in the range of from 1400 degrees Centigrade to 1500 degrees Centigrade;
    to form a hexagonal boron nitride reaction product in situ on the fiber reinforcement material by the reaction between B4C and Si3N4.

2. The method of claim 1, wherein said forming step comprises forming said layer of boron nitride solely on a surface of the fiber reinforcement material.

3. The method of claim 1, wherein said forming step comprises forming said layer of boron nitride so that said layer of boron nitride solely surrounds the fiber reinforcement material.

4. The method of claim 1, wherein the fiber reinforcement material is selected from the group consisting of silicon carbide (SiC), Si—C—O, Si—N—C—C, Si—B—C—N, carbon, aluminum oxide, zirconium oxide, glass, mullite, and silicon nitride fibers.

* * * * *